(12) United States Patent
Wang et al.

(10) Patent No.: US 12,211,887 B2
(45) Date of Patent: Jan. 28, 2025

(54) SEMICONDUCTOR DEVICES HAVING A RESISTOR STRUCTURE WITH MORE REFINED COUPLING EFFECT FOR IMPROVED LINEARITY OF RESISTANCE

(71) Applicant: MediaTek Singapore Pte. Ltd., Singapore (SG)

(72) Inventors: Lanxiang Wang, Singapore (SG); Zhigang Duan, Singapore (SG)

(73) Assignee: MediaTek Singapore Pte. Ltd., Singapore (SG)

( * ) Notice: Subject to any disclaimer, the term of this patent is extended or adjusted under 35 U.S.C. 154(b) by 413 days.

(21) Appl. No.: 17/830,348

(22) Filed: Jun. 2, 2022

(65) Prior Publication Data

US 2022/0416009 A1 Dec. 29, 2022

Related U.S. Application Data (60) Provisional application No. 63/213,797, filed on Jun. 23, 2021.

(51) Int. Cl.
*H01L 49/02* (2006.01)
*H01L 23/64* (2006.01)

(52) U.S. Cl.
CPC ............ *H01L 28/20* (2013.01); *H01L 23/647* (2013.01)

(58) Field of Classification Search
CPC .... H01L 28/20; H01L 27/0802; H01L 23/647
See application file for complete search history.

(56) References Cited

U.S. PATENT DOCUMENTS

| | | | |
|---|---|---|---|
| 6,369,409 B1 | 4/2002 | Takasu | |
| 6,989,566 B2 | 1/2006 | Noda | |
| 7,586,162 B1 | 9/2009 | Kelly | |
| 2009/0085657 A1* | 4/2009 | Yang | H03F 1/3211 330/75 |

FOREIGN PATENT DOCUMENTS

| | | |
|---|---|---|
| CN | 104137277 B | 8/2016 |
| EP | 1 265 285 A2 | 12/2002 |
| TW | 202014302 A | 4/2020 |

* cited by examiner

*Primary Examiner* — John A Bodnar
(74) *Attorney, Agent, or Firm* — Winston Hsu (57) ABSTRACT

A semiconductor device includes a first terminal, a second terminal positioned away from the first terminal, a first resistive segment coupled between the first terminal and the second terminal, a third terminal positioned away from the first terminal and the second terminal, a second resistive segment coupled between the second terminal and third terminal, a first floating plate disposed physically proximate the first resistive segment and including a first end coupled to one of the first terminal and the second terminal, and a second floating plate disposed physically proximate the second resistive segment and including a first end coupled to one of the second terminal and the third terminal.

20 Claims, 5 Drawing Sheets

SEMICONDUCTOR DEVICES HAVING A RESISTOR STRUCTURE WITH MORE REFINED COUPLING EFFECT FOR IMPROVED LINEARITY OF RESISTANCE

CROSS REFERENCE TO RELATED APPLICATIONS

This application claims the benefit of U.S. Provisional Application No. 63/213,797, filed on Jun. 23, 2021. The content of the application is incorporated herein by reference.

BACKGROUND

Resistors are optimally linear devices, that is, the output is directly proportional to the input. However, achieving a highly linear resistor in an integrated circuit is difficult or expensive. For example, the resistance of polycrystalline silicon (also referred to as polysilicon, poly-Si or simply poly) varies with the applied voltage in a non-linear fashion in the presence of an electric field. This non-linearity is caused by an accumulation of carriers (and thus reduced resistance) in the presence of a positive electric field, or conversely, by a depletion of carriers (and thus increased resistance) in the presence of a negative electric field.

Because such non-linearity is undesirable in many applications, a novel resistor structure with more refined coupling effect for improved linearity of resistance is highly required.

SUMMARY

According to an embodiment of the invention, a semiconductor device comprises a first terminal, a second terminal positioned away from the first terminal, a first resistive segment coupled between the first terminal and the second terminal, a third terminal positioned away from the first terminal and the second terminal, a second resistive segment coupled between the second terminal and third terminal, a first floating plate disposed physically proximate the first resistive segment and comprising a first end coupled to one of the first terminal and the second terminal, and a second floating plate disposed physically proximate the second resistive segment and comprising a first end coupled to one of the second terminal and the third terminal.

According to another embodiment of the invention, a semiconductor device comprises a first terminal, a second terminal positioned away from the first terminal, a first resistive segment coupled between the first terminal and the second terminal, a third terminal positioned away from the first terminal and the second terminal, a second resistive segment coupled between the second terminal and third terminal, a first floating plate disposed physically proximate the first resistive segment and comprising a first end coupled to one of the first terminal and the second terminal and a second end being a floating end, and a second floating plate disposed physically proximate the second resistive segment and comprising a first end coupled to one of the second terminal and the third terminal and a second end being a floating end. At most one of the first end of the first floating plate and the first end of the second floating plate is electrically coupled to the second terminal.

According to another embodiment of the invention, a semiconductor device comprises a first terminal, a second terminal positioned away from the first terminal, a first resistive segment coupled between the first terminal and the second terminal, a third terminal positioned away from the first terminal and the second terminal, a second resistive segment coupled between the second terminal and third terminal, a first floating plate disposed physically proximate the first resistive segment and comprising a first end coupled to the first terminal and a second end being a floating end, a second floating plate disposed physically proximate the second resistive segment and comprising a first end coupled to the third terminal and a second end being a floating end, a third floating plate disposed physically proximate the first resistive segment and comprising a first end coupled to the second terminal and a second end being a floating end, and a fourth floating plate disposed physically proximate the second resistive segment and comprising a first end coupled to the second terminal and a second end being a floating end. The first floating plate is disposed at one side of the first resistive segment and the third floating plate is disposed at another side of the first resistive segment, and the second floating plate is disposed at one side of the second resistive segment and the fourth floating plate is disposed at another side of the second resistive segment.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
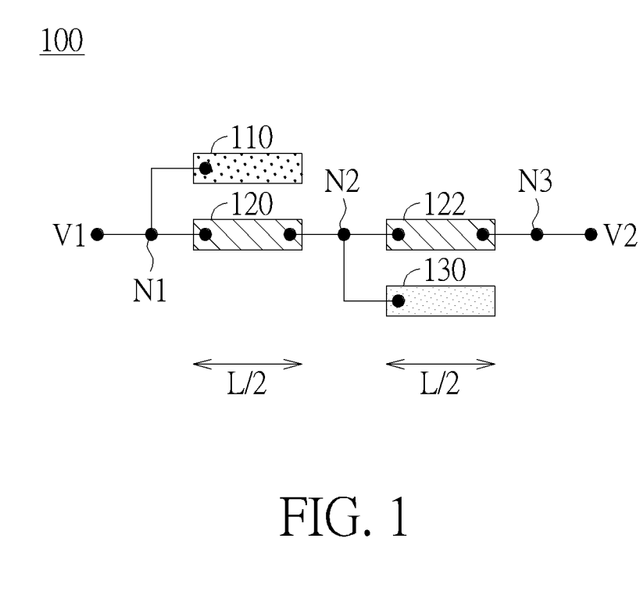
FIG. 1 shows a section view of a semiconductor device according to an embodiment of the invention.

FIG. 1 shows a section view of a semiconductor device according to an embodiment of the invention. According to an embodiment of the invention, the semiconductor device 100 may be a resistive device, such as a resistor. In the embodiments of the invention, the resistive device may be formed by multiple resistive segments. As shown in FIG. 1, the resistive device or the resistor may be formed by the resistive segments 120 and 122, where the resistive segments 120 and 122 may have the same length or substantially the same length. Suppose that the length of the resistive device or the resistor is L, the length of the resistive segment 120 may be L/2 and the length of the resistive segment 122 may also be L/2.

The semiconductor device 100 may comprises terminals N1, N2 and N3, where the terminal N2 is positioned away from the terminal N1 and the terminal N3 is positioned away from the terminals N1 and N2. The resistive segment 120 is coupled between the terminals N1 and N2, and the resistive segment 122 is coupled between the terminals N2 and N3.

According to an embodiment of the invention, the resistive segments 120 and 122 may have resistances that vary non-linearly with applied voltage. In an embodiment of the invention, the resistive segments 120 and 122 may comprise polycrystalline silicon resistive elements.

In one of the proposed structures with more refined coupling effect for supreme linearity, as shown in FIG. 1, at least a first floating plate, such as the floating plate 110, may be disposed physically proximate the resistive segment 120 and a second floating plate, such as the floating plate 130, may be disposed physically proximate the resistive segment 122. In an embodiment of the invention, the floating plate 110 is disposed at one side of the resistive segment 120 (as well as the resistive segments 120 and 122), and the floating plate 130 is disposed at an opposite side of the resistive segment 122 (as well as the resistive segments 120 and 122). In addition, in an embodiment of the invention, the floating plate 110 may be a top floating plate and the floating plate 130 may be a bottom floating plate.

The floating plate 110 may comprise one end being a non-floating end (that is, being coupled to a terminal) and another end being a floating end (that is, not coupled to any terminal). The floating plate 130 may also comprise one end being a non-floating end and another end being a floating end (that is, not coupled to any terminal).

As an example, a first end (non-floating end) of the floating plate 110 is coupled to one of the terminal N1 and the terminal N2 and a first end (i.e. the non-floating end) of the floating plate 130 is coupled to one of the terminal N2 and the terminal N3. Note that in some embodiments of the invention, at most one of them is electrically coupled or connected to the terminal N2. Therefore, in some other embodiments of the invention, none of them being electrically coupled or connected to the terminal N2 may also be possible.

In a first embodiment of the invention, as shown in FIG. 1, the first end (i.e. the non-floating end) of the floating plate 110 is coupled to the terminal N1 and the first end (i.e. the non-floating end) of the floating plate 130 is coupled to the terminal N2.

It is to be noted that although two resistive segments is shown in FIG. 1, the number of resistive segments is not a limit of the invention.

Figure 2:
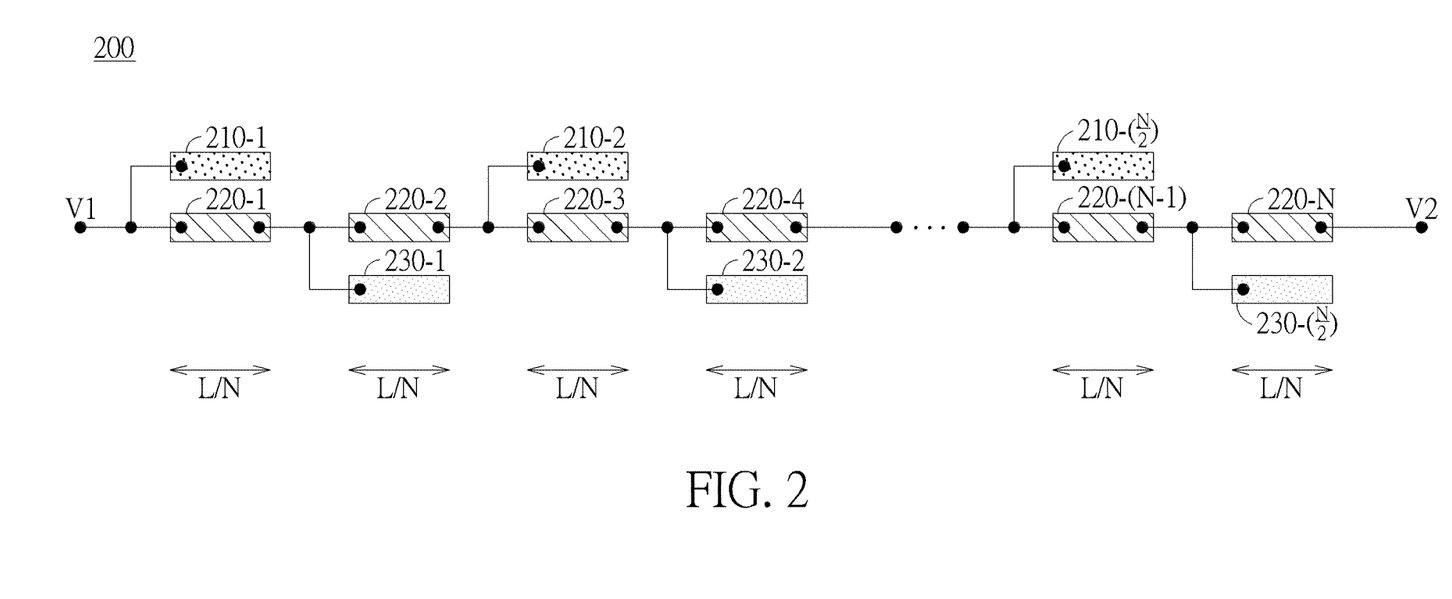
FIG. 2 shows a section view of a semiconductor device according to a first embodiment of the invention.

FIG. 2 shows a section view of a semiconductor device according to a first embodiment of the invention. According to an embodiment of the invention, the semiconductor device 200 may be a resistive device, such as a resistor, and may be formed by N resistive segments, such as the resistive segments 220-1, 220-2, 220-3, 220-4 . . . 220-(N−1) and 220-N, where the resistive segments 220-1~220-N have the same length or substantially the same length. Suppose that the length of the resistive device or the resistor is L, the length of each resistive segment may be L/N, where L is a positive number and N is a positive number greater than 1.

According to an embodiment of the invention, the resistive segments 220-1~220-N may have resistances that vary non-linearly with applied voltage. In an embodiment of the invention, the resistive segments 220-1~220-N may comprise polycrystalline silicon resistive elements.

In the proposed structures with more refined coupling effect for supreme linearity, as shown in FIG. 2, multiple floating plates, such as the top floating plates 210-1, 210-2 . . . 210-(N/2), may be disposed physically proximate and above the resistive segment 220-1, 220-3 . . . 220-(N−1), and multiple floating plates, such as the bottom floating plates 230-1, 230-2 . . . 230-(N/2), may be disposed physically proximate and under the resistive segment 220-2, 220-4 . . . 220-N.

Each resistive segment, except for the last resistive segment 220-N, may comprise two terminals with one terminal being electrically coupled or connected to a top floating plate and another terminal being electrically coupled or connected to a bottom floating plate. In addition, each floating plate in FIG. 2 has one end being a floating end.

By implementing the proposed structure, non-linearity of resistance of one resistive segment at least partially compensates for non-linearity of resistance of another (as an example, the adjacent) resistive segment. To be more specific, when two different voltages, e.g. the voltages V1 and V2 as shown, are respectively applied to two terminals of the resistive device (or, the resistor formed by the resistive segments), by virtue of the connections of the terminals of the resistive segments to the terminals (or, one ends) of the top floating plates and the terminals (or, one ends) of the bottom floating plates, respectively, the electric fields may be generated between the resistive segments and the top floating plates and between the resistive segments and the bottom floating plates. Consequently, the variation in impedance in a resistive segment is offset by the variation in impedance in one or more adjacent resistive segments.

According to an embodiment of the invention, the floating plates may be implemented by well process or metal process. As an example, the top floating plates 210-1, 210-2 . . . 210-(N/2) may be implemented by a metal layer and the bottom floating plates 230-1, 230-2 . . . 230-(N/2) may be implemented by a substrate well, such as a N-well or P-well. As another example, the top floating plates 210-1, 210-2 . . . 210-(N/2) may be implemented by a first metal layer and the bottom floating plates 230-1, 230-2 . . . 230-(N/2) may be implemented by a second metal layer. In addition, a first isolation layer or isolation region formed of a dielectric material may be interposed between the top floating plates 210-1, 210-2 . . . 210-(N/2) and the resistive segments 220-1, 220-3 . . . 220-(N−1), and a second isolation layer or isolation region formed of a dielectric material may be interposed between the resistive segments 220-2, 220-4 . . . 220-N and the bottom floating plates 230-1, 230-2 . . . 230-(N/2).

Referring back to FIG. 1, in a second embodiment of the invention, the first end (i.e. the non-floating end) of the floating plate 110 may be coupled to the terminal N2 and the first end (i.e. the non-floating end) of the floating plate 130 may be coupled to the terminal N3.

Figure 3:
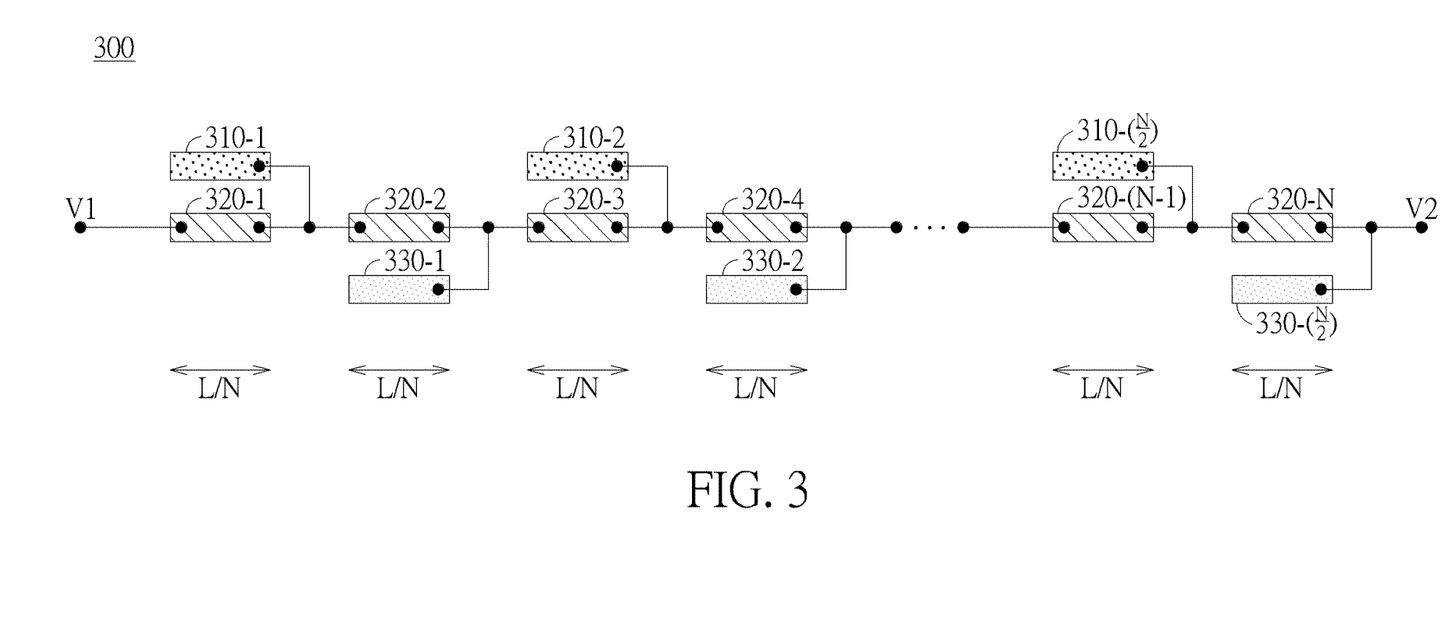
FIG. 3 shows a section view of a semiconductor device according to a second embodiment of the invention.

FIG. 3 shows a section view of a semiconductor device according to a second embodiment of the invention. According to an embodiment of the invention, the semiconductor device 300 may be a resistive device, such as a resistor, and may be formed by N resistive segments, such as the resistive segments 320-1, 320-2, 320-3, 320-4 . . . 320-(N−1) and 320-N, where the resistive segments 320-1~320-N have the same length or substantially the same length. Suppose that the length of the resistive device or the resistor is L, the length of each resistive segment may be L/N, where L is a positive number and N is a positive number greater than 1.

According to an embodiment of the invention, the resistive segments 320-1~320-N may have resistances that vary non-linearly with applied voltage. In an embodiment of the invention, the resistive segments 320-1~320-N may comprise polycrystalline silicon resistive elements.

In the proposed structures with more refined coupling effect for supreme linearity, as shown in FIG. 3, multiple floating plates, such as the top floating plates 310-1, 310-2 . . . 310-(N/2), may be disposed physically proximate and above the resistive segment 320-1, 320-3 . . . 320-(N−1), and multiple floating plates, such as the bottom floating plates 330-1, 330-2 . . . 330-(N/2), may be disposed physically proximate and under the resistive segment 320-2, 320-4 . . . 320-N.

Each resistive segment, except for the first resistive segment 320-1, may comprise two terminals with one terminal being electrically coupled or connected to a top floating plate and another terminal being electrically coupled or connected to a bottom floating plate. In addition, each floating plate in FIG. 3 has one end being a floating end.

By implementing the proposed structure, non-linearity of resistance of one resistive segment at least partially compensates for non-linearity of resistance of another (as an example, the adjacent) resistive segment. To be more specific, when two different voltages, e.g. the voltages V1 and V2 as shown, are respectively applied to two terminals of the resistive device (or, the resistor formed by the resistive segments), by virtue of the connections of the terminals of the resistive segments to the terminals (or, one ends) of the top floating plates and the terminals (or, one ends) of the bottom floating plates, respectively, the electric fields may be generated between the resistive segments and the top floating plates and between the resistive segments and the bottom floating plates. Consequently, the variation in impedance in a resistive segment is offset by the variation in impedance in one or more adjacent resistive segments.

According to an embodiment of the invention, the floating plates may be implemented by well process or metal process. As an example, the top floating plates 310-1, 310-2 . . . 310-(N/2) may be implemented by a metal layer and the bottom floating plates 330-1, 330-2 . . . 330-(N/2) may be implemented by a substrate well, such as a N-well or P-well. As another example, the top floating plates 310-1, 310-2 . . . 310-(N/2) may be implemented by a first metal layer and the bottom floating plates 330-1, 330-2 . . . 330-(N/2) may be implemented by a second metal layer. In addition, a first isolation layer or isolation region formed of a dielectric material may be interposed between the top floating plates 310-1, 310-2 . . . 310-(N/2) and the resistive segments 320-1, 320-3 . . . 320-(N−1), and a second isolation layer or isolation region formed of a dielectric material may be interposed between the resistive segments 320-2, 320-4 . . . 320-N and the bottom floating plates 330-1, 330-2 . . . 330-(N/2).

Again, referring back to FIG. 1, in a third embodiment of the invention, the first end (i.e. the non-floating end) of the floating plate 110 may be coupled to the terminal N1 and the first end (i.e. the non-floating end) of the floating plate 130 may be coupled to the terminal N3. Since it would be no doubt for those skilled in the art to derive the structure of the semiconductor device in third embodiment of the invention with N resistive segments comprised therein based on the teachings of FIG. 2 and FIG. 3, the corresponding drawing and descriptions are omitted here for brevity.

In a fourth embodiment of the invention, based on the structure shown in FIG. 1, one more floating plate may be added and disposed physically proximate the resistive segment 120 and with respect to the floating plate 110 which is also disposed physically proximate the resistive segment 120, and a first end (non-floating end) of this floating plate is coupled to another of the terminal N1 and the terminal N2. Note that the two floating plates disposed physically proximate the resistive segment 120 may be disposed at different or opposite side of the resistive segment 120, and both of the two floating plates have one end being a floating end.

Similarly, one more floating plate may be added and disposed physically proximate the resistive segment 122 and with respect to the floating plate 130 which is also disposed physically proximate the resistive segment 122, and a first end (non-floating end) of this floating plate is coupled to another of the terminal N2 and the terminal N3. Note that the two floating plates disposed physically proximate the resistive segment 122 may be disposed at different or opposite side of the resistive segment 122, and both of the two floating plates have one end being a floating end.

Figure 4:
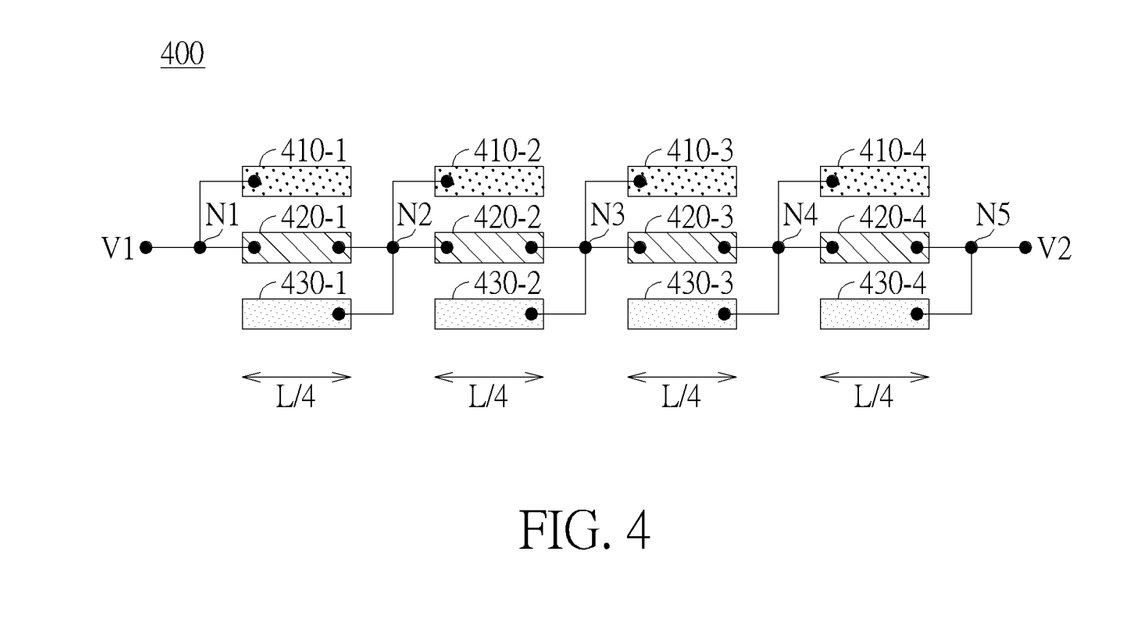
FIG. 4 shows a section view of a semiconductor device according to a fourth embodiment of the invention.

FIG. 4 shows a section view of a semiconductor device according to a fourth embodiment of the invention. According to an embodiment of the invention, the semiconductor device 400 may be a resistive device, such as a resistor, and may be formed by 4 resistive segments, such as the resistive segments 420-1, 420-2, 420-3 and 420-4, where the resistive segments 420-1~420-4 have the same length or substantially the same length. Suppose that the length of the resistive device or the resistor is L, the length of each resistive segment may be L/4.

The semiconductor device 400 may comprises terminals N1, N2, N3, N4 and N5. The resistive segment 420-1 is coupled between the terminals N1 and N2, the resistive segment 420-2 is coupled between the terminals N2 and N3, the resistive segment 420-3 is coupled between the terminals N3 and N4 and the resistive segment 420-4 is coupled between the terminals N4 and N5.

According to an embodiment of the invention, the resistive segments 420-1~420-4 may have resistances that vary non-linearly with applied voltage. In an embodiment of the invention, the resistive segments 420-1~420-4 may comprise polycrystalline silicon resistive elements.

In the proposed structures with more refined coupling effect for supreme linearity, as shown in FIG. 3, floating plates, such as the top floating plates 410-1~410-4, may be disposed physically proximate and above the resistive segment 420-1~420-4, and floating plates, such as the bottom floating plates 430-1~430-4, may be disposed physically proximate and under the resistive segment 420-1~420-4.

As shown in FIG. 4, two floating plates 410-1 and 430-1 are disposed physically proximate the resistive segment 420-1 and are disposed at different or opposite side of the resistive segment 420-1, where the first end (i.e. the non-floating end) of the floating plate 410-1 is coupled to the terminal N1 and the first end (i.e. the non-floating end) of the floating plate 430-1 is coupled to the terminal N2. Similarly, two floating plates 410-2 and 430-2 are disposed physically proximate the resistive segment 420-2 and are disposed at different or opposite side of the resistive segment 420-2, where the first end (i.e. the non-floating end) of the floating plate 410-2 is coupled to the terminal N2 and the first end (i.e. the non-floating end) of the floating plate 430-2 is coupled to the terminal N3, and the rest may be deduced by analogy.

In the fourth embodiment, two floating plates disposed at different or opposite side of the resistive segments may be electrically coupled or connected to the same terminal. As an example, the top floating plate 410-2 and the bottom floating plate 430-1 may both be electrically coupled or connected to the terminal N2, the top floating plate 410-3 and the bottom floating plate 430-2 may both be electrically coupled or connected to the terminal N3, and so on.

By implementing the proposed structure, non-linearity of resistance of one resistive segment at least partially compensates for non-linearity of resistance of another (as an example, the adjacent) resistive segment. To be more specific, when two different voltages, e.g. the voltages V1 and V2 as shown, are respectively applied to two terminals of the resistive device (or, the resistor formed by the resistive segments), by virtue of the connections of the terminals of the resistive segments to the terminals (or, one ends) of the top floating plates and the terminals (or, one ends) of the bottom floating plates, respectively, the electric fields may be generated between the resistive segments and the top floating plates and between the resistive segments and the bottom floating plates. Consequently, the variation in impedance in a resistive segment is offset by the variation in impedance in one or more adjacent resistive segments.

It is to be noted that although four resistive segments is shown in FIG. 4, the number of resistive segments is not a limit of the invention.

Figure 5:
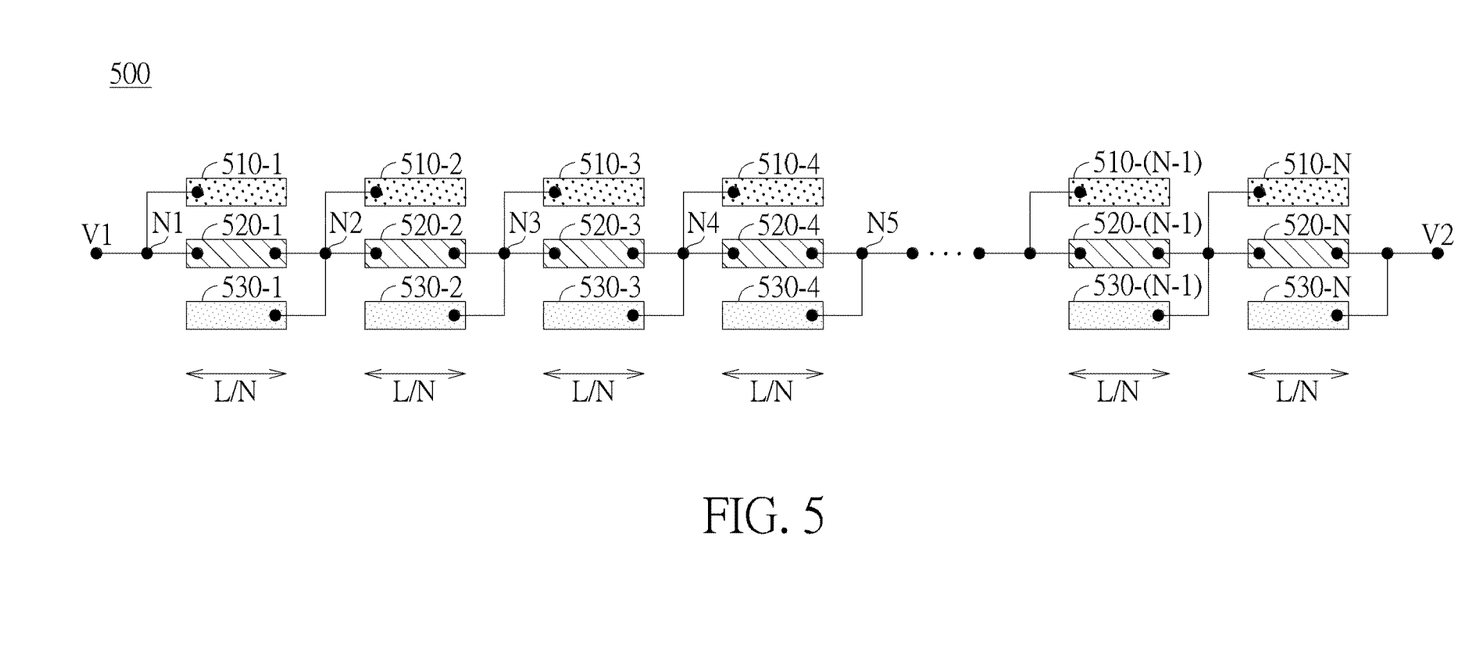
FIG. 5 shows another exemplary semiconductor device according to the fourth embodiment of the invention.

FIG. 5 shows another exemplary semiconductor device according to the fourth embodiment of the invention, which may be an extension of the structure shown in FIG. 4. The semiconductor device 500 may be a resistive device, such as a resistor, and may be formed by N resistive segments, such as the resistive segments 520-1, 520-2, 520-3, 520-4 . . . 520-(N−1) and 520-N, where the resistive segments 520-1~520-N have the same length or substantially the same length. Suppose that the length of the resistive device or the resistor is L, the length of each resistive segment may be L/N, where L is a positive number and N is a positive number greater than 1.

In the proposed structures with more refined coupling effect for supreme linearity, as shown in FIG. 5, a pair of floating plates, comprising one top floating plate and one bottom floating plate, may be disposed physically proximate one resistive segment and disposed at different sides or opposite sides of that resistive segment. Therefore, in the fourth embodiment, each resistive segment may comprise two terminals with one terminal being electrically coupled or connected to a top floating plate and another terminal being electrically coupled or connected to a bottom floating plate. In addition, each floating plate in FIG. 5, such as the top floating plates 510-1~510-N disposed above the resistive segments 520-1~520-N and the bottom floating plates 530-1~530-N disposed under the resistive segments 520-1~520-N, has one end being a floating end.

Note that in the fourth embodiment of the invention, the pair of floating plates disposed physically proximate the same resistive segment are electrically coupled or connected to different terminals of that resistive segment. As an example, the pair of floating plates 510-1 and 530-1 disposed physically proximate the same resistive segment 520-1 are electrically coupled or connected to different terminals N1 and N2 of the resistive segment 520-1, the pair of floating plates 510-2 and 530-2 disposed physically proximate the same resistive segment 520-2 are electrically coupled or connected to different terminals N2 and N3 of the resistive segment 520-2, and the rest may be deduced by analogy. In this manner, the pair of floating plates disposed physically proximate the same resistive segment may be coupled with different electric potential when two different voltages, e.g. the voltages V1 and V2 as shown, are respectively applied to two terminals of the resistive device.

In addition, a pair of floating plates disposed physically proximate adjacent resistive segment may be electrically coupled or connected to the same terminal. As an example, the pair of floating plates 510-2 and 530-1 are both electrically coupled or connected to the terminal N2, the pair of floating plates 510-3 and 530-2 are both electrically coupled or connected to the terminal N3, and the rest may be deduced by analogy.

Similarly, by implementing the proposed structure, non-linearity of resistance of one resistive segment at least partially compensates for non-linearity of resistance of another (as an example, the adjacent) resistive segment.

According to an embodiment of the invention, the floating plates may be implemented by well process or metal process. As an example, the top floating plates 510-1~510-N may be implemented by a metal layer and the bottom floating plates 530-1~530-N may be implemented by a substrate well, such as a N-well or P-well. As another example, the top floating plates 510-1~510-N may be implemented by a first metal layer and the bottom floating plates 530-1~530-N may be implemented by a second metal layer. In addition, a first isolation layer or isolation region formed of a dielectric material may be interposed between the top floating plates 510-1~510-N and the resistive segments 520-1~520-N, and a second isolation layer or isolation region formed of a dielectric material may be interposed between the resistive segments 520-1~520-N and the bottom floating plates 530-1~530-N.

By implementing the proposed resistor structures with more refined coupling effect as illustrated above in the embodiments of the invention, linearity of resistance of the resistor or resistive device is greatly improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a first terminal;
a second terminal, positioned away from the first terminal;
a first resistive segment, coupled between the first terminal and the second terminal;
a third terminal, positioned away from the first terminal and the second terminal;
a second resistive segment, coupled between the second terminal and third terminal;
a first floating plate, disposed physically proximate the first resistive segment and comprising a first end coupled to one of the first terminal and the second terminal; and
a second floating plate, disposed physically proximate the second resistive segment and comprising a first end coupled to one of the second terminal and the third terminal.

2. The semiconductor device of claim 1, wherein the first floating plate further comprises a second end which is a floating end, and when the first end of the first floating plate is coupled to the second terminal, the first end of the second floating plate is coupled to the third terminal.

3. The semiconductor device of claim 1, wherein the second floating plate further comprises a second end which is a floating end, and when the first end of the second floating plate is coupled to the second terminal, the first end of the first floating plate is coupled to the first terminal.

4. The semiconductor device of claim 1, wherein the first floating plate is disposed at one side of the first resistive segment and the second resistive segment, and the second floating plate is disposed at an opposite side of the first resistive segment and the second resistive segment.

5. The semiconductor device of claim 1, further comprising:
a third floating plate, disposed physically proximate the first resistive segment and comprising a first end coupled to another of the first terminal and the second terminal,
wherein the first floating plate is disposed at one side of the first resistive segment and the third floating plate is disposed at an opposite side of the first resistive segment.

6. The semiconductor device of claim 1, further comprising:
a fourth floating plate, disposed physically proximate the second resistive segment and comprising a first end coupled to another of the second terminal and the third terminal,
wherein the second floating plate is disposed at one side of the second resistive segment and the fourth floating plate is disposed at an opposite side of the second resistive segment.

7. The semiconductor device of claim 1, wherein the first resistive segment and the second resistive segment have substantially a same length.

8. The semiconductor device of claim 1, further comprising:
a first isolation layer, interposed between the first resistive segment and the first floating plate; and
a second isolation layer, interposed between the second resistive segment and the second floating plate.

9. The semiconductor device of claim 1, wherein the first resistive segment and the second resistive segment comprise polycrystalline silicon resistive elements.

10. A semiconductor device, comprising:
a first terminal;
a second terminal, positioned away from the first terminal;
a first resistive segment, coupled between the first terminal and the second terminal;
a third terminal, positioned away from the first terminal and the second terminal;
a second resistive segment, coupled between the second terminal and third terminal;
a first floating plate, disposed physically proximate the first resistive segment and comprising a first end coupled to one of the first terminal and the second terminal and a second end being a floating end; and
a second floating plate, disposed physically proximate the second resistive segment and comprising a first end coupled to one of the second terminal and the third terminal and a second end being a floating end,
wherein at most one of the first end of the first floating plate and the first end of the second floating plate is electrically coupled to the second terminal.

11. The semiconductor device of claim 10, wherein when the first end of the first floating plate is coupled to the second terminal, the first end of the second floating plate is coupled to the third terminal, and when the first end of the second floating plate is coupled to the second terminal, the first end of the first floating plate is coupled to the first terminal.

12. The semiconductor device of claim 10, wherein the first floating plate is disposed at one side of the first resistive segment and the second resistive segment, and the second floating plate is disposed at an opposite side of the first resistive segment and the second resistive segment.

13. The semiconductor device of claim 10, further comprising:
a third floating plate, disposed physically proximate the first resistive segment and comprising a first end coupled to another of the first terminal and the second terminal and a second end being a floating end,
wherein the first floating plate is disposed at one side of the first resistive segment and the third floating plate is disposed at an opposite side of the first resistive segment.

14. The semiconductor device of claim 10, further comprising:
a fourth floating plate, disposed physically proximate the second resistive segment and comprising a first end coupled to another of the second terminal and the third terminal and a second end being a floating end,
wherein the second floating plate is disposed at one side of the second resistive segment and the fourth floating plate is disposed at an opposite side of the second resistive segment.

15. The semiconductor device of claim 10, further comprising:
a third floating plate, disposed physically proximate the first resistive segment; and
a fourth floating plate, disposed physically proximate the second resistive segment,
wherein the first floating plate is disposed at one side of the first resistive segment and the third floating plate is disposed at another side of the first resistive segment, the second floating plate is disposed at one side of the second resistive segment and the fourth floating plate is disposed at another side of the second resistive segment, and
wherein when the first end of the first floating plate is coupled to the first terminal, the first end of the second floating plate is coupled to the third terminal, and a first end of the third floating plate and a first end of the fourth floating plate are both coupled to the second terminal.

16. The semiconductor device of claim 10, wherein the first resistive segment and the second resistive segment have substantially a same length.

17. The semiconductor device of claim 10, further comprising:
a first isolation layer, interposed between the first resistive segment and the first floating plate; and
a second isolation layer, interposed between the second resistive segment and the second floating plate.

18. The semiconductor device of claim 10, wherein the first resistive segment and the second resistive segment comprise polycrystalline silicon resistive elements.

19. A semiconductor device, comprising:
a first terminal;
a second terminal, positioned away from the first terminal;
a first resistive segment, coupled between the first terminal and the second terminal;
a third terminal, positioned away from the first terminal and the second terminal;
a second resistive segment, coupled between the second terminal and third terminal;
a first floating plate, disposed physically proximate the first resistive segment and comprising a first end coupled to the first terminal and a second end being a floating end;
a second floating plate, disposed physically proximate the second resistive segment and comprising a first end coupled to the third terminal and a second end being a floating end;
a third floating plate, disposed physically proximate the first resistive segment and comprising a first end coupled to the second terminal and a second end being a floating end; and
a fourth floating plate, disposed physically proximate the second resistive segment and comprising a first end coupled to the second terminal and a second end being a floating end,
wherein the first floating plate is disposed at one side of the first resistive segment and the third floating plate is disposed at another side of the first resistive segment, and the second floating plate is disposed at one side of the second resistive segment and the fourth floating plate is disposed at another side of the second resistive segment.

20. The semiconductor device of claim 19, wherein the first resistive segment and the second resistive segment have substantially a same length.

\* \* \* \* \*